United States Patent
Hsu et al.

[19]

[11] Patent Number: 5,932,904
[45] Date of Patent: Aug. 3, 1999

[54] TWO TRANSISTOR FERROELECTRIC MEMORY CELL

[75] Inventors: Sheng Teng Hsu; Jong Jan Lee, both of Camas, Wash.

[73] Assignees: Sharp Laboratories of America, Inc., Camas, Wash.; Sharp Kabushiki Kaisha, Osaka, Japan

[21] Appl. No.: 08/870,161

[22] Filed: Jun. 6, 1997

Related U.S. Application Data

[63] Continuation-in-part of application No. 08/812,579, Mar. 7, 1997, Pat. No. 5,731,608.

[51] Int. Cl.$^6$ .................................................. H01L 21/8242
[52] U.S. Cl. ............................................ 257/295; 257/300
[58] Field of Search ................................ 438/3; 257/295, 257/300, 303–311, 287, 281, 256, 261

[56] References Cited

U.S. PATENT DOCUMENTS

| | | | |
|---|---|---|---|
| 3,832,700 | 8/1974 | Wu et al. ............................. | 340/173.2 |
| 4,419,809 | 12/1983 | Riseman et al. ........................ | 29/591 |
| 5,070,029 | 12/1991 | Pfiester et al. ............................ | 437/29 |
| 5,300,799 | 4/1994 | Nakamura et al. ..................... | 257/295 |
| 5,303,182 | 4/1994 | Nakao et al. ............................ | 365/145 |
| 5,345,415 | 9/1994 | Nakao et al. ............................ | 365/145 |
| 5,365,094 | 11/1994 | Takasu .................................... | 257/295 |
| 5,373,462 | 12/1994 | Achard et al. .......................... | 365/145 |
| 5,416,735 | 5/1995 | Onishi et al. ........................... | 365/145 |
| 5,424,238 | 6/1995 | Sameshima . | |
| 5,431,958 | 7/1995 | Desu et al. .......................... | 427/255.3 |
| 5,446,688 | 8/1995 | Torimaru ................................ | 365/145 |
| 5,744,374 | 4/1998 | Moon . | |

FOREIGN PATENT DOCUMENTS 4-256361  9/1992  Japan .

OTHER PUBLICATIONS

Jiang et al. "A New Electrode Technology for High–Density Nonvolatile Ferroelectric ($SrBi_2Ta_2O_9$) Memories", IEEE 1996 Symposium on VLSI Technology Digest of Technical Papers, pp. 26–27, 1966.

*Primary Examiner*—Jey Tsai
*Attorney, Agent, or Firm*—David C. Ripma; Gerald Maliszewski

[57] ABSTRACT

The method of forming the two transistor semi-conductor structure includes forming a device area for a MOS transistor and for a ferroelectric memory (FEM) gate unit on a silicon substrate. A conventional MOS transistor is formed on the substrate. A FEM cell includes a FEM gate unit formed on the substrate, either above or along side of the MOS transistor. The FEM gate unit is spaced apart from a source region and a drain region. Formation of the various conductive channels may take place at various stages of the manufacture, depending on what other devices are built on the substrate, and depending on the efficiencies of the various orders of construction. The structure of the two transistor semiconductor includes a silicon substrate, which may be a bulk silicon substrate or an SOI-type substrate. Conductive channels of three types are located above the substrate. A FEM gate unit is located above a gate region, either over or along side of a conventional MOS transistor, wherein the FEM gate unit includes a lower metal layer, an FE layer, and an upper metal layer.

6 Claims, 5 Drawing Sheets

TWO TRANSISTOR FERROELECTRIC MEMORY CELL

RELATED APPLICATION

This application is a continuation-in-part of application Ser. No. 08/812,579, filed Mar. 7, 1997, of Hsu et al., now U.S. Pat. No. 5,731,608 for ONE TRANSISTOR FERROELECTRIC MEMORY CELL AND METHOD OF MAKING THE SAME.

BACKGROUND OF THE INVENTION

This application relates to ferroelectric thin films which are used in nonvolatile memories and specifically to a shallow junction metal-ferroelectric-metal-silicon semiconductor. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM. Known FRAMs have a fatigue problem that has been observed in the ferroelectric capacitor, which is one of the major obstacles that limit the viable commercial use of such memories. The fatigue is the result of a decrease in the switchable polarization (stored nonvolatile charge) that occurs with an increased number of switching cycles. As used in this case, "switching cycles" refers to the sum of reading and writing pulses in the memory.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a non-destructive readout (NDR). The latter feature enables a MFS FET device to be read thousands of times without switching the ferroelectric polarization. Fatigue, therefore, is not a significant concern when using MFS FET devices. Various forms of MFS FET structures may be constructed, such as metal ferroelectric insulators silicon (MFIS) FET, metal ferroelectric metal silicon (MFMS) FET, and metal ferroelectric metal oxide silicon (MFMOS) FET.

There are a number of problems that must be overcome in order to fabricate an efficient MFS FET device. The first problem is that it is difficult to form an acceptable crystalline ferroelectric thin film directly on silicon. Such structure is shown in U.S. Pat. No. 3,832,700. Additionally, it is very difficult to have a clean interface between the ferroelectric material and the silicon. Further, there is a problem retaining an adequate charge in the ferroelectric material. A FEM structure on a gate region is shown in U.S. Pat. No. 5,303,182, which emphasizes that the transfer of metal ions into the gate region is undesirable. Similar structure is shown in U.S. Pat. No. 5,416,735.

It is an object of this invention to overcome the aforementioned problems.

An object of the invention is to provide a FEM memory cell that has minimal leakage current.

Yet another object of the invention to provide an MFS FET device that occupies a relatively small surface area.

Another object of the invention to provide an MFS FET device that includes a MOS transistor overlaid with a FEM cell.

Another object of the invention is to provide an MFS FET device which provides a non-destructive readout.

A further object of the invention is to provide an MFS FET device which requires a relatively low programming voltage.

The method of forming the two transistor semi-conductor structure of the invention includes forming a device area for a MOS transistor and for a ferroelectric memory (FEM) gate unit on a silicon substrate. Appropriate impurities are implanted into the device area to form conductive channels, for use as a source junction region, a gate junction region and a drain junction region. A conventional MOS transistor is formed on the substrate. A FEM cell includes a FEM gate unit formed on the substrate, either above or along side of the MOS transistor. A gate junction region is formed between the source junction region and the drain junction region for the FEM gate unit, which FEM gate unit includes a lower metal layer, a ferroelectric (FE) layer, and an upper metal layer. The FEM gate unit is spaced apart from the source region and the drain region, as is the conductive channel between the FEM gate unit and the gate junction region. Formation of the various conductive channels may take place at various stages of the manufacture, depending on what other devices are built on the substrate, and depending on the efficiencies of the various orders of construction.

The structure of the two transistor semiconductor includes a silicon substrate, which may be a bulk silicon substrate or an SOI-type substrate. Conductive channels of three types are located above the substrate. A FEM gate unit is located above a gate region, either over or along side of a conventional MOS transistor, wherein the FEM gate unit includes a lower metal layer, an FE layer, and an upper metal layer.

These and other objects and advantages of the invention will become more fully apparent as the description which follows is read in conjunction with the drawings.

DETAILED DESCRIPTION OF THE PREFERRED EMBODIMENTS

The ferroelectric memory (FEM) cell of the invention may be formed on a SOI (SIMOX) substrate, or, it may be formed in a bulk silicon substrate. The description herein will concentrate on the formation of the FEM gate unit on a bulk silicon substrate, however, as used herein, "silicon substrate" refers to either a SOI substrate or to a bulk silicon substrate. It should be appreciated that a MOS transistor and a FEM gate unit are fabricated sequentially or simultaneously in order to form the two transistor structure of the invention. The completed structure provides a cost effective, extremely small memory cell, that has a simple circuit configuration, provides a non-volatile memory, and has a very low leakage current.

Figure 1:
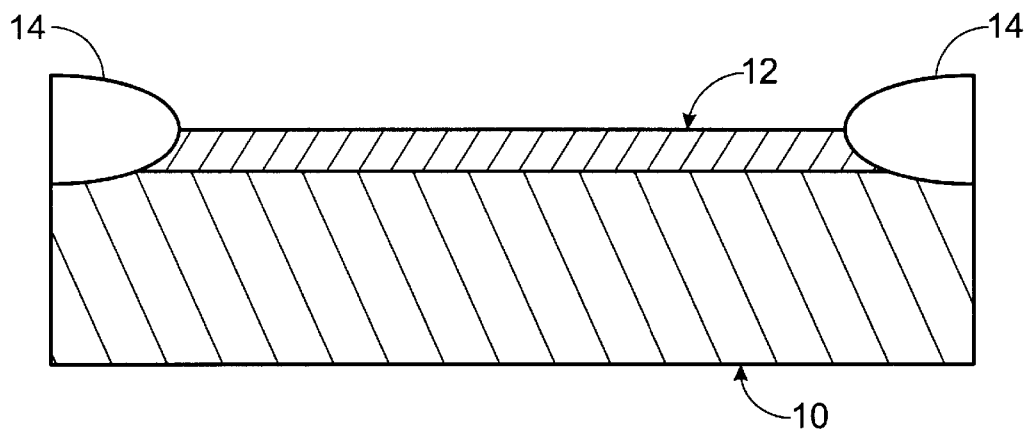
FIGS. 1–4 depict successive stages of preparation of the substrate and formation of an active region used for the FEM cell of the invention.

Turning now to FIG. 1, a silicon substrate is depicted at 10. Substrate 10, in this embodiment is a single-crystal substrate, and is formed of bulk silicon. As depicted in FIG. 1, substrate 10 has been modified to the configuration depicted, and a portion of the substrate has been lightly doped to form an active region, or device area, 12, which provides a desired background polarity, in this case, that of an $n^-$ region, referred to herein as a conductive channel of a first type. Phosphorous ions, also referred to herein as doping impurities of a first type, are implanted to form the conductive channel of the first type at an energy of between 30 keV to 120 keV, with a dose of $1.0 \cdot 10^{12}$ cm$^{-2}$ to $5.0 \cdot 10^{13}$ cm$^{-2}$ to the $p^-$ well where the FEM gate units are to be constructed. Multiple implantation steps, and/or thermal diffusion may be required to obtain an optimum donor distribution in the $n^-$ layer. The implanted $n^-$ type silicon layer may also be replaced with a selective epitaxial growth of silicon with a thickness of 100 nm to 1000 nm. Active region 12 is bounded by an insulating region 14, formed of SiO$_2$ by thermal oxidation or deposited by chemical vapor deposition (CVD), to form LOCOS or mesa isolation between devices. As is well known to those of a skill in the art, a multiplicity of such active regions are formed on the surface of a silicon wafer. For the two transistor memory cell of the invention, the active regions are arranged in a perpendicular grid to form a memory array, as will be described later herein.

Figure 2:
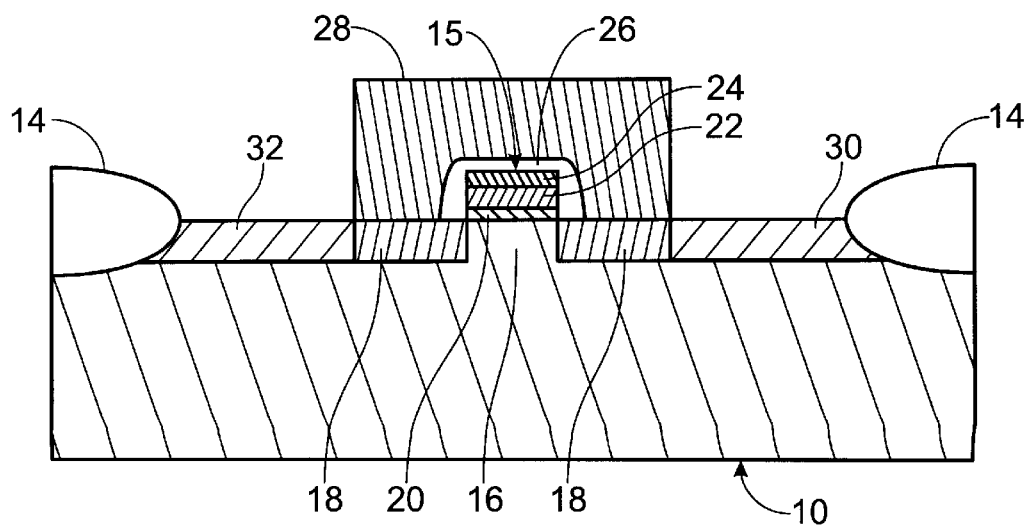

Referring now to FIG. 2, the construction of the semiconductor device of the invention is seen to have progressed to a point where a MOS transistor 15 has been formed on the substrate. Active region 12 has been modified to include a $p^-$ well 16, which is accomplished by masking active region 12, and ion implantation. This $p^-$ layer may be formed by implanting B or BF$_2$ ions, referred to herein as doping impurities of a second type, on active layer 12. Boron ions may be implanted at an energy of 3 keV to 10 keV, while BF$_2$ ions are implanted with an energy level of between 15 keV and 50 keV. Ion concentration in both instances is in the range of $5 \cdot 10^{11}$ cm$^{-2}$ to $1 \cdot 10^{13}$ cm$^{-2}$. The ions are thermally activated by annealing. The implanted ions will diffuse into the $n^-$ active region, to form a $p^-$ n layer, referred herein as a conductive channel of a second type. Annealing takes place at a temperature in a range of between 500° C. and 1100° C. A channel region 18, the conductive channel of the first type, remains on either side of $p^-$ well 16.

The lateral portions of active region 12 are masked, and a layer of SiO$_2$, 20, is formed by CVD over $p^-$ well 16 and portions of channel regions 18. A layer of $n^+$ polysilicon is deposited thereover, again by CVD. A layer of silicide 24, may be formed over the $n^+$ polysilicon by CVD, and functions as a part of the MOS transistor, which, although depicted in the drawing, is an optional portion of the method and structure of the invention. Another layer of SiO$_2$, 26, also referred to herein as a transistor insulating layer, is laid down by CVD.

Alternately, a layer of SiO$_2$ may be deposited on the non-masked regions of $p^-$ well 16 and channel regions 18, the SiO$_2$ layer etched to form sidewalls, and $n^+$ polysilicon layer 22 and layer 24 deposited therein. A top layer of SiO$_2$ is deposited over the sidewalls and layer 24.

The MOS transistor is covered with a photo-resist 28, which covers MOS transistor 15 as well as the channel regions 18 for the FEM gate unit. The remainder of device area 12 is then treated by arsenic ion implantation to form an $n^+$ silicon source region 30 and an $n^+$ silicon drain region 32, referred to herein as conductive channels of a third type. Appropriate ion implantation in this instance may be the implantation of As ions at a preferred energy of about 50 keV, although implantation in a range of 40 keV to 70 keV is acceptable, and a dosing in a range of $1 \cdot 10^{15}$ cm$^{-2}$ to $5 \cdot 10^{15}$ cm$^{-2}$. Alternately, phosphorus ions may be implanted in an energy range of 30 keV–60 keV in the same dosing range. In either case, the material implanted at this step of the construction is referred to herein as a doping impurity of a third type.

Figure 3:
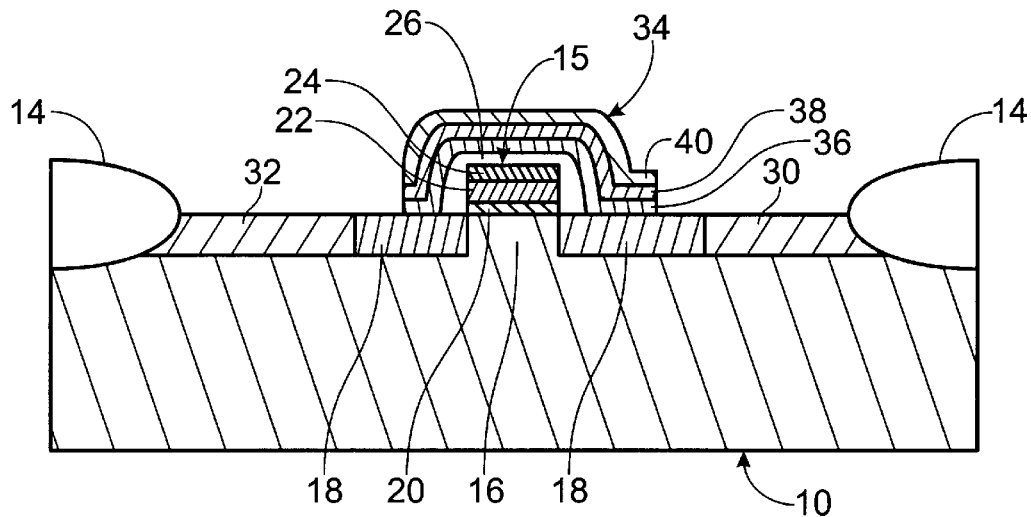

The photoresist is stripped away. Referring now to FIG. 3, FEM gate unit 34 is fabricated. Gate unit 34 includes a lower electrode 36, a FE layer 38, and an upper electrode 40. The construction of FEM gate unit 34 begins with the deposition of the lower electrode on SiO$_2$ layer 26, which extends partially over channel regions 18. Lower electrode 36 may be formed of Pt or Ir, IrO$_2$, or an alloy of Pt/Ir, or other suitable conductive material. Other appropriate conductive barrier layer material may also be used. The thickness of electrode 36 is 20 nm to 100 nm, in the preferred embodiment.

Next, FE material 38 is deposited by CVD. The FE material may be any of the following: Pb(Zr, Ti)O$_3$ (PZT), SrBi$_2$Ta$_2$O$_9$ (SBT), Pb$_5$Ge$_3$O$_{11}$, BaTiO$_3$, or LiNbO$_3$. The preferred compounds are, in order of preference, Pb$_5$Ge$_3$O$_{11}$, SBT and PZT. Most of the experimental work in the field of FEM gate units has been done on PZT compounds. FE material 38 is deposited to a thickness of 50 nm to 400 nm.

Upper electrode 40 is then formed over the FE material. The upper electrode may be formed of the same materials as the lower electrode, to a thickness of 20 nm to 200 nm.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

Figure 4:
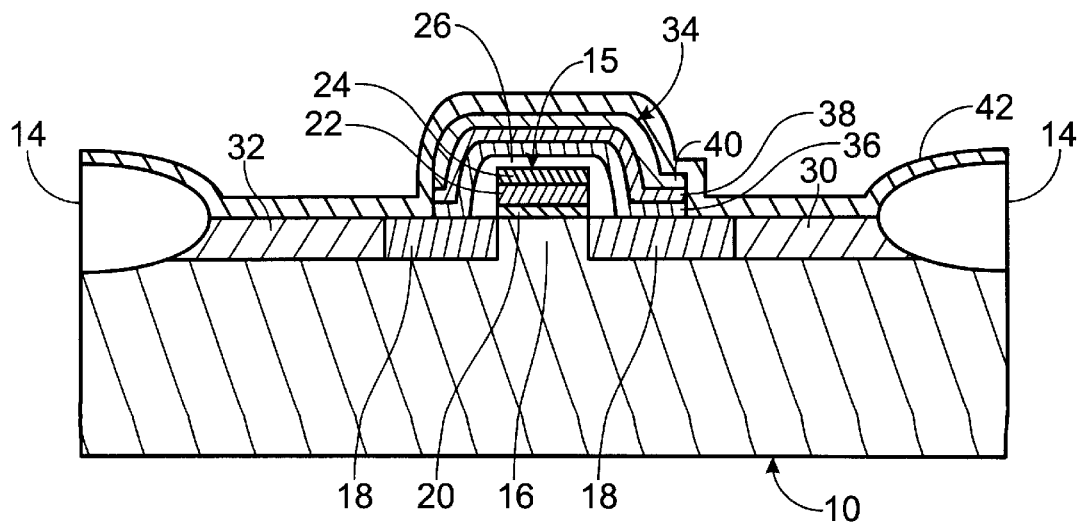

Referring now to FIG. 4, the photo-resist is stripped from the FEM gate unit and a layer of TiO$_x$ 42, Si$_3$N$_4$, or other suitable dielectric material is deposited by CVD to isolate the ferroelectric material from the silicon oxide.

The structure is completed with the deposition of a silicon oxide layer 44, a covering insulating layer, over the extend of the structure, and the milling and insertion of a drain electrode 46, a gate electrode 48, and a source electrode 50.

Figure 5:
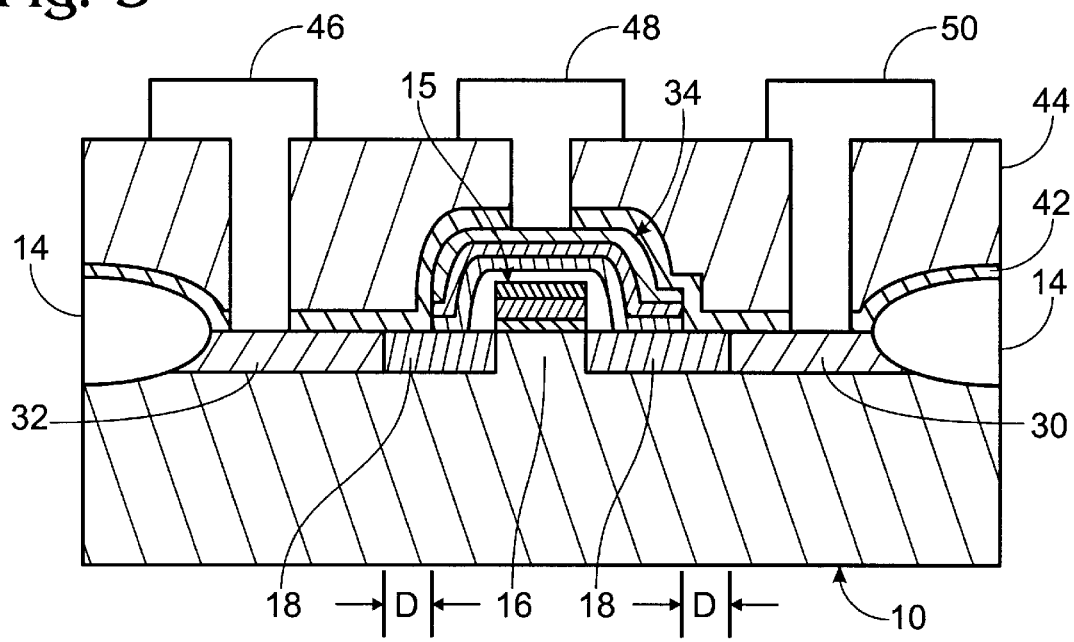
FIG. 5 depicts the completed two transistor memory cell as constructed on a bulk silicon substrate.
Figure 6:
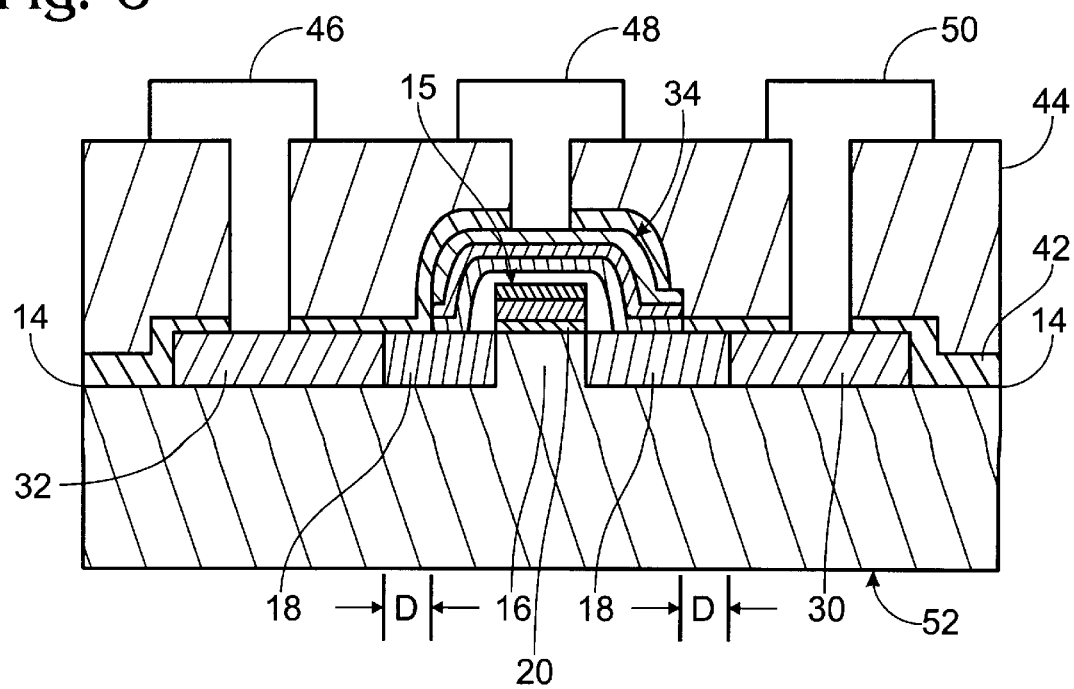
FIG. 6 depicts the completed two transistor memory cell as constructed on a SOI substrate.

Referring now to FIG. 6, the structure of the invention is depicted as would be formed on an SOI substrate, which includes substantially all of the same components, referred to by like reference numbers, except that the substrate is formed of silicon oxide 52 rather than the bulk silicon used in the embodiment in FIG. 5.

Figure 7:
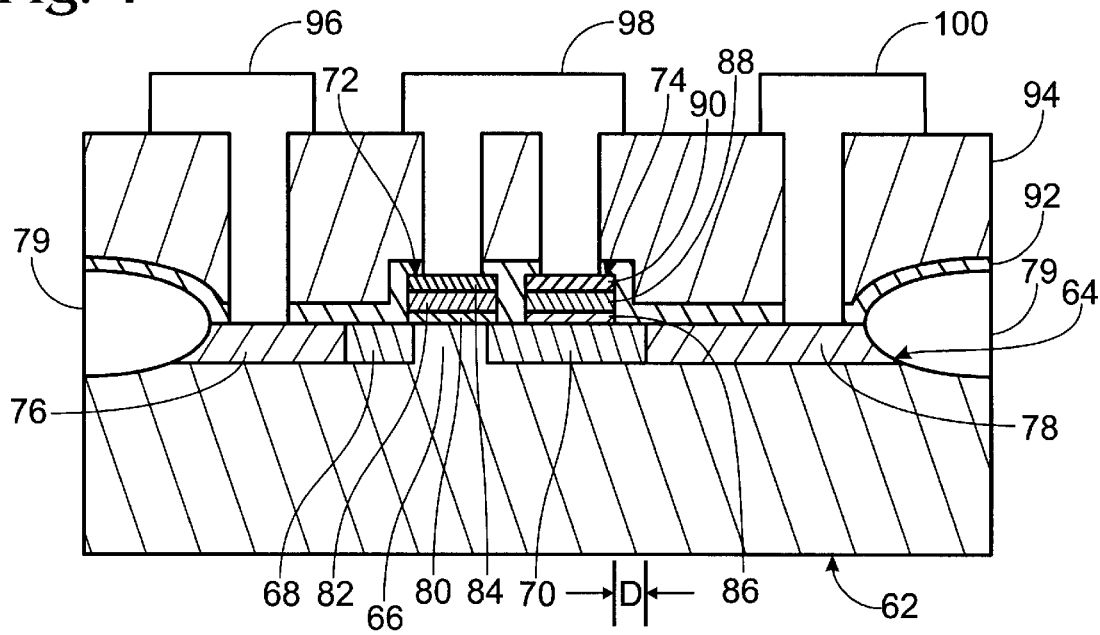
FIG. 7 depicts an alternate embodiment of the completed two transistor memory cell as constructed on a SOI substrate.

Turning now to FIG. 7, an alternate embodiment of the memory cell is depicted generally at 60. In this embodiment, and using bulk silicon as a substrate 62, an active region 64 is formed and subsequently modified into a $p^-$ well 66, $n^-$ regions 68, 70 which serve as gate region for the MOS transistor 72 and FEM cell 74, respectively. An $n^+$ drain region 76 is formed as is an $n^+$ source region 78. Oxide regions 79 flank active region 64, and are formed by thermal oxidation or by CVD. The materials for both MOS transistor 72 and FEM gate unit 74 are laid down sequentially, those layers being, for MOS transistor 72, an $SiO_2$ layer 80, an $n^+$ polysilicon layer 82, and an optional silicide layer 84. FEM gate unit 74 is formed by depositing a bottom electrode 86, the FE material 88, and a top electrode 90. Next, a layer of $TiO_x$, $Si_3N_4$, or other suitable insulator, 92 is deposited, by CVD, and a layer of $SiO_2$ 94 is deposited, also by CVD. Fabrication is completed by the installation of a drain electrode 96, a gate electrode 98, and a source electrode 100. The MOS transistor and the FEM are isolated with the $TiO_x$ or $Si_3N_4$ layer. In this embodiment, layer 92 functions as a transistor insulating layer while layer 94 functions as a covering insulating layer.

Thus, several embodiments of a combination of a MFS transistor formed adjacent to a MOS transistor have been shown. As used herein, "adjacent" means that the two transistors are formed either along side one another, or that one transistor overlays the other.

The embodiments depicted in FIGS. 5, 6 and 7 represent a ferroelectric gate depletion-type MIS transistor in combination with a conventional MOS transistor. The threshold voltage of the MFS transistor may be negative when the FE is polarized with a positive charge at the bottom electrode interface 38a. When the FE is polarized with a negative charge at the bottom electrode interface 38a, the threshold voltage of the MFS transistor is very large. At zero gate voltage, the MOS transistor is not conductive. Therefore, there is no current flow through the device even if the threshold voltage of the MFS transistor is negative.

When the gate voltage is equal to the operation voltage, the MOS transistor is very conductive. The device current is controlled by the current flow in the MFS transistor. When the MFS transistor is at "0" state, i.e., the threshold voltage is larger than the operation voltage, there is no current flow through the device. In order to maintain a small leakage current at the "0" state, the distance between any edge of lower electrode 36 and 86, and any edge of the $n^+$ source and $n^+$ drain regions, represented by "D", has to be at least 50 nm. However, as D increases, the series resistance of the memory cell also increases. It is therefore preferred that D be no larger than 300 nm. When the MFS transistor is at the "1" state, i.e., the threshold voltage is very low, or has a negative value, both the MOS transistor and the MFS transistor are conductive. Therefore, a large current can flow through the device. This enables the device to be used in large scale memory arrays even if the "1" state threshold voltage of the MFS transistor is a negative value.

Operation

Figure 8:
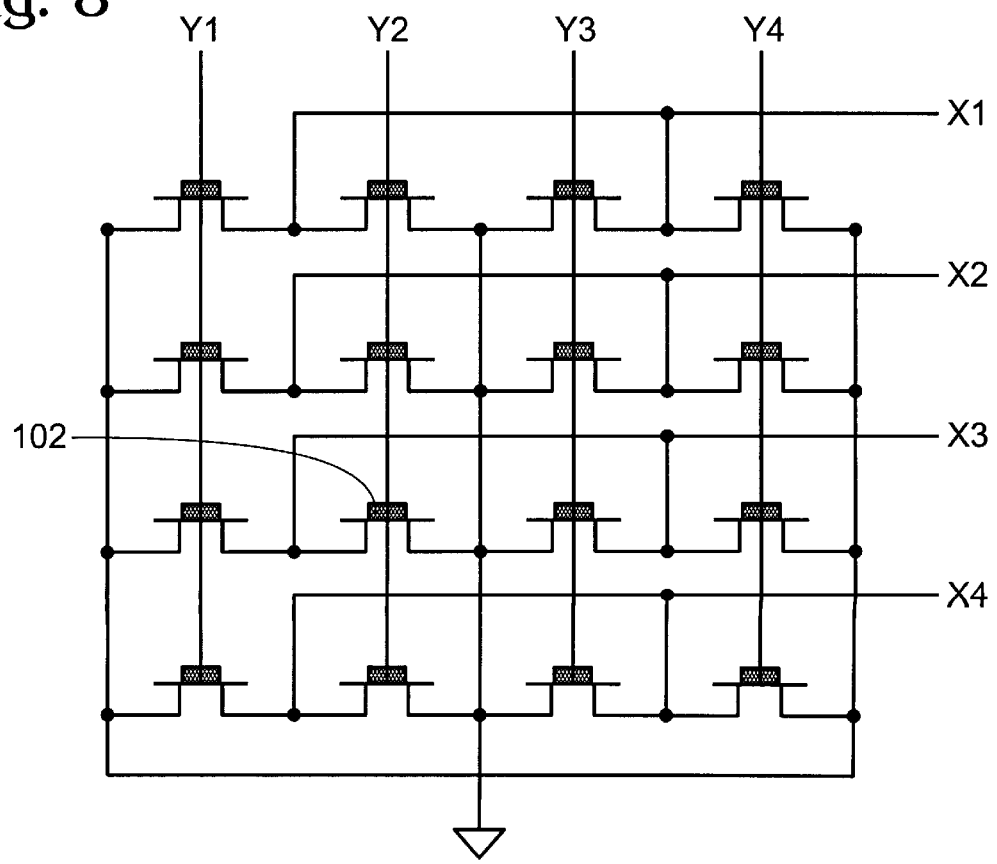
FIG. 8 depicts a 4×4 array of the memory cells of the invention.
Figure 9A:
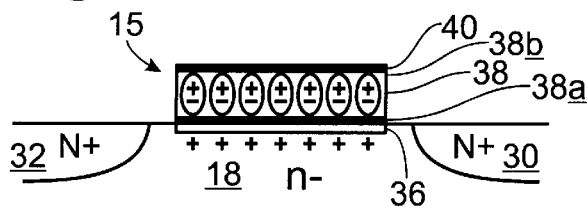
FIGS. 9A–9B depict the basic operation principle for the MFS FET devices of the invention.
Figure 9B:
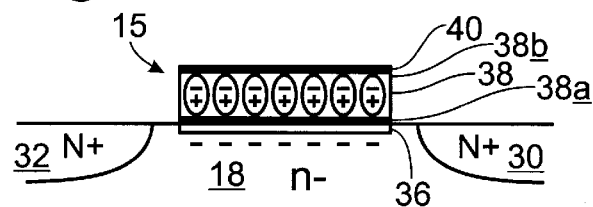

Memory cells constructed according to the invention may be placed in an array of memory cells such that the gate lines run perpendicular to the drain lines, as shown in FIG. 8. Referring now to FIGS. 5, 8 and 9, in order to write to FEM gate unit 34, $+V_{p1}$ is applied to all gate electrodes 48, (Y1, Y2, Y3 and Y4), while the source electrodes 50 and drain electrodes 46 (X1, X2, X3 and X4) of the memory cell are at the ground potential. This polarizes FE 38 such that a positive charge is located at lower electrode interface 38a and a negative charge is located at upper electrode interface 38b. (See FIG. 9b). This places FEM gate unit 34 in a high conductive state.

When a negative voltage, $-V_{p0}$, is applied to the gate electrode 48 (program line), Y2 for instance, a positive voltage, $+V_{p0}$ is applied to drain 32, X3 for instance, and source 30 is grounded, and where $|V_{p1}|>|V_{p0}|$, the FE, such as 102, X3, Y2, is polarized with a negative charge at lower electrode interface 38a. This places FEM gate unit 34 in a low conductive state. (see FIG. 9a). The write process enables each memory transistor in a memory array to be written to independent of other memory cells in the array, with no interference to the other memory cells in the array.

The threshold voltage for FEM gate unit 15, 74, shown in FIGS. 5 and 7, may be determined as follows: for a large scale array the threshold voltage at the "1" state may be negative or a small positive voltage. The threshold voltage for the "0" state has to be larger than the supply voltage, i.e., 3.3 V.

The width of the space in the $n^-$ region of a Pt-n silicon barrier is about 0.3 μm if the doping density of the $n^-$ region is about $1.0 \cdot 10^{16}$ $cm^{-3}$. The threshold voltage may be adjusted by changing the doping density and the thickness of the $n^-$ channel layer, and the permitivity and the remnant charge of the ferroelectric capacitor.

During a read operation, a voltage, $V_a$, of no larger than the coercive voltage, i.e., that voltage where the memory content may change, is applied to the gate electrode and the drain electrode. Because the content of the memory cell is not disturbed when any electrode is biased with $V_a$, the read operation will not disturb the memory contents of any memory cell. Therefore, a long charge retention is obtained.

Figure 10A:
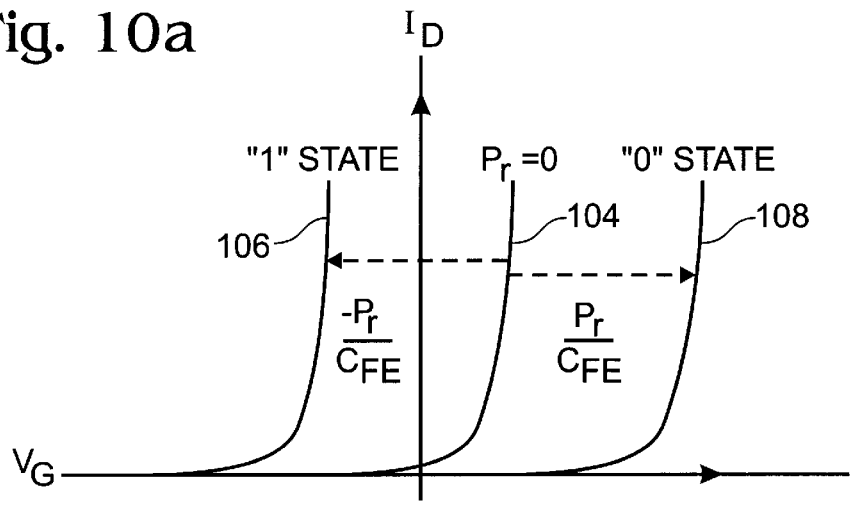
FIGS. 10A–10B are a graph of $I_D$ VS. $V_G$ for the FEM gate unit of the invention.

The general $I_D$ VS. $V_G$ plot for the MFMOS FET is depicted in FIG. 10. FIG. 10a depicts the $I_D$ VS. $V_G$ characteristics of a FEM cell with high channel doping, $N_D$. The centerline 104 is the $I_D$ VS. $V_0$ curve when the FEM gate unit is not charged. When the FEM cell is programmed to a "1" state, line 106, the threshold voltage of the FEM cell is negative. When the FEM cell is programmed to a "0" state, line 108, the threshold voltage of the FEM cell is positive. Thus, at the "1" state, a large drain current may flow through the channel region even if $V_G=0V$. Such a device alone is not suitable for large scale array applications.

Figure 10B:
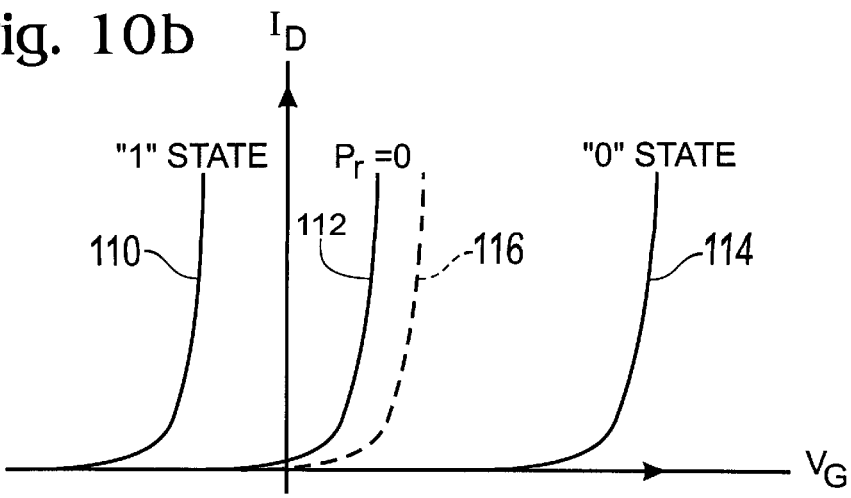

FIG. 10b depicts the $I_D$ VS. $V_G$ characteristics of the device of this invention. Line 112 depicts the $I_D$ VS. $V_0$ curve when the FEM gate unit is not charged. When the FEM cell is programmed to a "1" state, line 110, the threshold voltage of the FEM cell is negative. When the FEM cell is programmed to a "0" state, line 114, the threshold voltage of the FEM cell is positive. The threshold voltage, dashed line 116, of the MOS transistor limited the threshold voltage of the device to a small positive value when it is programmed to a "1" state. No current may flow through the device when the gate is at ground potential. A large scale memory array of such devices will have a very small standby leakage current.

Thus, a two-transistor memory cell, including a MOS transistor and an FEM gate unit, and a method of constructing same has been disclosed. Although a preferred embodiment of the invention, and a variation thereof have been disclosed, it should be appreciated that further variations may be made to the architecture and method without departing from the scope of the invention as defined in the appended claims.

We claim:

1. A two transistor memory cell comprising:
   a silicon substrate including an active region therein, wherein said active region is doped with a first doping impurity to form a conductive channel of a first type;
   a channel region located in said active region, doped with a doping impurity of a second type to form a conductive channel of a second type;
   a source junction region and a drain junction region located in said active region on either side of said gate junction region, doped to form a pair of conductive channels of a third type;

a MOS transistor located adjacent said conductive channel of said second type;

a FEM gate unit including a lower metal layer, a FE layer and an upper metal layer; wherein said FEM gate unit at least partially overlays said conductive channel of said first type, and is sized on the gate junction region such that any edge of said FEM gate unit is a distance "D" from the edges of said source junction region and said drain junction region, where "D" is between about 50 nm and 300 nm;

a transistor insulating layer located between said MOS transistor and said FEM gate unit;

a covering insulating layer extending over said conductive channels, said MOS transistor and said FEM gate unit; and a source electrode and a drain electrode, each located on the upper surface of said covering insulating layer and extending therethrough to make electrical contact with their respective junction regions, wherein said drain electrode makes contact with said drain junction region and said conductive channel of said second type, and a gate electrode located on the upper surface of said covering insulating layer and extending therethrough to make electrical contact with the upper metal layer of said FEM gate unit.

2. The memory cell of claim 1 wherein said conductive channel of said second type includes ions implanted therein, and wherein the ions are taken from the group consisting of B and $BF_2$, implanted at an energy in a range of 3 keV to 10 keV and 15 keV to 50 keV, respectively, and a dose of $1 \cdot 10^{11}$ $cm^{-2}$ to $1 \cdot 10^{13}$ $cm^{-2}$, which diffuse from the device area during annealing of the structure at a temperature of about 500° C. to 1100° C.

3. The memory cell of claim 1 wherein said FEM gate unit includes a lower metal layer of Pt, having a thickness of about 20 nm to 100 nm, a FE layer of material taken from the group consisting of $Pb(Zr, Ti)O_3$ (PZT), $SrBi_2Ta_2O_9$ (SBT), $Pb_5Ge_3O_{11}$, $BaTiO_3$ and $LiNbO_3$, having a thickness of about 100 nm to 400 nm, and an upper metal layer of material taken from the group consisting of Pt, Ir, $IrO_2$ and Pt/Ir alloy, having a thickness of 20 nm to 100 nm.

4. The memory cell of claim 1 wherein said active region includes ions taken from the group consisting of As, implanted at an energy of about 40 keV to 70 keV, and phosphorous, implanted at an energy of about 30 keV to 60 keV, the ions having a dose of about $1 \cdot 10^{15}$ $cm^{-2}$ to $5 \cdot 10^{15}$ $cm^{-2}$.

5. The memory cell of claim 1 wherein said FEM gate unit overlays said MOS transistor.

6. The memory cell of claim 1 wherein said MOS transistor and said FEM gate unit are arranged side-by-side.

* * * * *